United States Patent
Do

(10) Patent No.: US 11,217,616 B2
(45) Date of Patent: *Jan. 4, 2022

(54) IMAGE SENSING DEVICE

(71) Applicant: SK hynix Inc., Icheon-si (KR)

(72) Inventor: Young Woong Do, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 21 days.

This patent is subject to a terminal disclaimer.

(21) Appl. No.: 16/704,388

(22) Filed: Dec. 5, 2019

(65) Prior Publication Data

US 2021/0066369 A1    Mar. 4, 2021

(30) Foreign Application Priority Data

Sep. 2, 2019    (KR) .................. 10-2019-0108188

(51) Int. Cl.
*H01L 27/146*    (2006.01)

(52) U.S. Cl.
CPC .... *H01L 27/14621* (2013.01); *H01L 27/1463* (2013.01); *H01L 27/14627* (2013.01); *H01L 27/14629* (2013.01); *H01L 27/14645* (2013.01)

(58) Field of Classification Search
CPC ......... H01L 27/14621; H01L 27/14627; H01L 27/14629; H01L 27/271463; H01L 27/14645
USPC .................................................. 257/432
See application file for complete search history.

(56) References Cited

U.S. PATENT DOCUMENTS

| | | |
|---|---|---|
| 9,728,570 B2 | 8/2017 | Chiang |
| 2013/0285181 A1* | 10/2013 | Lin ...................... H01L 27/1463 257/432 |
| 2015/0108574 A1* | 4/2015 | Sung ................. H01L 27/10855 257/347 |
| 2015/0263054 A1 | 9/2015 | Chien |
| 2016/0172398 A1 | 6/2016 | Kim |
| 2017/0133414 A1* | 5/2017 | Chiang ............. H01L 27/14627 |
| 2017/0373116 A1 | 12/2017 | Lin et al. |
| 2019/0157329 A1* | 5/2019 | Kim .................. H01L 27/14612 |
| 2020/0013809 A1* | 1/2020 | Lee ...................... H01L 27/1464 |

FOREIGN PATENT DOCUMENTS

| | | |
|---|---|---|
| KR | 10-2015-0044646 | 4/2015 |
| KR | 10-2016-0072513 | 6/2016 |
| KR | 1020200082333 A | 7/2020 |

* cited by examiner

*Primary Examiner* — Dzung Tran
(74) *Attorney, Agent, or Firm* — Perkins Coie LLP

(57) ABSTRACT

An image sensing device includes a substrate layer structured to include photoelectric conversion elements, grid structures disposed over the substrate layer to divide space above the substrate into different sensing regions, and color filter layers disposed over the photoelectric conversion elements between the grid structures. The grid structures includes an air layer, a light guide layer disposed over the air layer, and a capping film configured to cover the air layer and the light guide layer.

14 Claims, 10 Drawing Sheets

IMAGE SENSING DEVICE

CROSS-REFERENCE TO RELATED APPLICATION

This patent document claims the priority and benefits of Korean patent application No. 10-2019-0108188, filed on Sep. 2, 2019, the disclosure of which is incorporated by reference in its entirety as part of the disclosure of this patent document.

TECHNICAL FIELD

The technology and implementations disclosed in the patent document generally relate to an image sensing device.

BACKGROUND

An image sensor is a device for converting an optical image into electrical signals. With the development of automotive, medical, computer, and communication industries, the demand for high-performance image sensors is increasing in various devices such as digital cameras, camcorders, personal communication systems (PCSs), game consoles, surveillance cameras, medical micro-cameras, robots, etc.

SUMMARY

The embodiments of the disclosed technology, among other features and benefits, relate to an image sensing device that can increase the amount of light beams that pass color filters and are collected by photoelectric conversion elements.

Embodiments of the disclosed technology relate to an image sensing device for preventing incident light applied to an upper region of a grid structure from being absorbed into a metal layer of the grid structure, and allowing the incident light applied to the upper region of the grid structure to be introduced into a photoelectric conversion element, resulting in an increased amount of photoelectric conversion light.

In an embodiment of the disclosed technology, an image sensing device may include a substrate layer structured to include photoelectric conversion elements, grid structures disposed over the substrate layer to divide space above the substrate into different sensing regions, and color filter layers disposed over the photoelectric conversion elements between the adjacent grid structures. Each of the grid structures may include an air layer, a light guide layer disposed over the air layer, and a capping film configured to cover the air layer and the light guide layer.

In another embodiment of the disclosed technology, an image sensing device may include a substrate layer structured to include photoelectric conversion elements, grid structures disposed over the substrate layer to divide space above the substrate into different sensing regions with each sensing region including one or more photoelectric conversion elements, and color filter layers disposed over the photoelectric conversion elements between adjacent grid structures, respectively. Each of the grid structures includes a low-index layer, a light guide layer disposed over the low-index layer, and configured to have refractive index higher than a refractive index of the low-index layer, and a capping film configured to cover the low-index layer and the light guide layer, wherein the capping film has a refractive index higher than the refractive index of the low-index layer.

In another embodiment of the disclosed technology, an image sensing device may include a substrate layer in which an array of photoelectric conversion elements is formed, grid structures disposed over the substrate layer to divide space above the substrate into different sensing regions with each sensing region including one or more photoelectric conversion elements, and color filter layers disposed over the photoelectric conversion elements between adjacent grid structures, respectively. Each of the grid structures includes a light guide layer at an upper portion of the grid structure, and wherein the light guide layer is structured to cause light beams of a first range of incidence angle to be reflected within top and bottom surfaces of the light guide layer and propagate toward a targeted color filter from a sidewall of the light guide layer, and cause light beams of a second range of incidence angle to be deflected toward the targeted color filter through the light guide layer.

In another embodiment of the disclosed technology, an image sensing device may include an image sensing device may include a substrate layer including at least one photoelectric conversion element, grid structures disposed over the substrate layer, and at least one color filter layer disposed between the grid structures. Each of the grid structures may include a low-index layer such as a layer of air or an air layer, a light guide layer disposed over low-index layer or the air layer, and configured to allow light incident upon an upper region of the grid structure to be reflected in multiple ways, and a capping film configured to cap the low-index layer or air layer and the light guide layer.

It is to be understood that both the foregoing general description and the following detailed description of the disclosed technology are illustrative and explanatory and are intended to provide further explanation of the disclosure as claimed.

DETAILED DESCRIPTION

Reference will now be made in detail to certain embodiments, examples of which are illustrated in the accompanying drawings. Wherever possible, the same reference numbers will be used throughout the drawings to refer to the same or similar parts.

Figure 1:
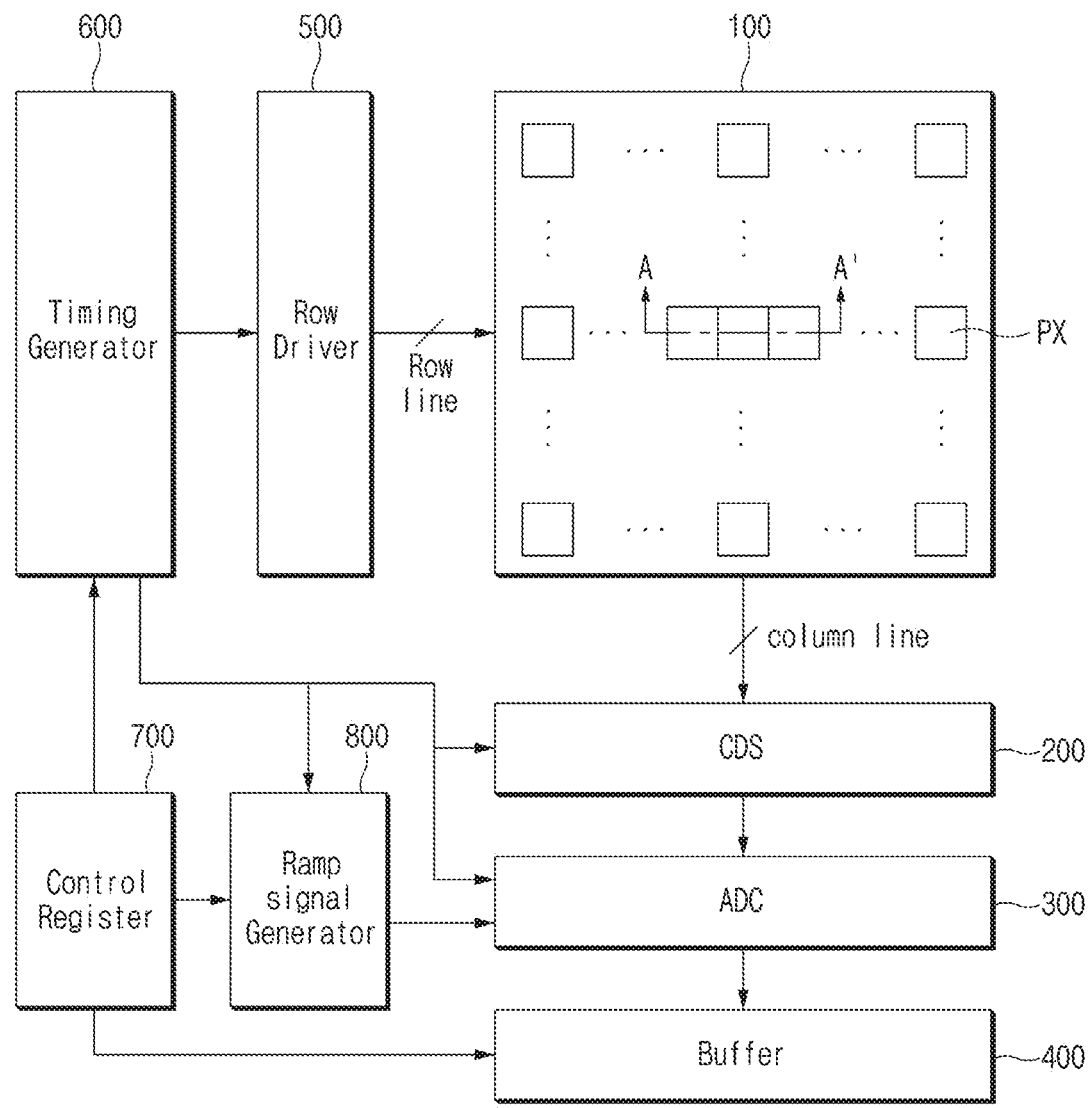
FIG. 1 is an example of a block diagram illustrating an image sensing device based on some implementations of the disclosed technology.

FIG. 1 is an example of a block diagram illustrating an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) arranged in a two-dimensional (2D) array in which unit pixels are arranged in first and second directions perpendicular to each other. Each of the unit pixels (PXs) may include a photosensitive element to convert light incident onto the unit pixel into an electrical signal to generate a pixel signal, and may output the pixel signal to the correlated double sampler (CDS) 200 through column lines. The pixel array 100 may also include row signal lines and column signal lines arranged in rows and columns of the 2D array, and the unit pixels (PXs) are coupled to the row and column signal lines. The pixel array 100 may include a grid structure that can reduce occurrence of crosstalk between neighboring imaging pixels. In one example, the grid structure based on an embodiment may be formed as a hybrid structure including a metal layer and an air layer. Specifically, the grid structure may prevent incident light applied to a top surface of the grid structure from being absorbed into the metal layer, and may guide the light incident onto the top surface of the grid structure toward at least one color filter of the unit pixel.

In some implementations, the image sensing device may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. The correlated double sampler (CDS) 200 may hold and sample electrical image signals received from the pixels (PXs) of the pixel array 100. For example, the correlated double sampler (CDS) 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) 300.

In some implementations, the ADC 300 may use a reference signal (e.g., ramp signal) to sample an input signal (e.g., pixel signal) multiple times using the reference signal and analog-to-digital convert the sampled input signals by counting the number of clock pulses until crossing points. For example, the ADC 300 may count clock pulses during a period of time when the input signal is above the reference signal and stop counting clock pulses upon detection of a crossing point (crossing of the reference signal and the input signal).

In some implementations, the analog-to-digital converter (ADC) 300 may compare a ramp signal received from the ramp signal generator 800 with a sampling signal received from the correlated double sampler (CDS) 200, and may thus output a comparison signal indicating the result of comparison between the ramp signal and the sampling signal. The analog-to-digital converter (ADC) 300 may count the number of crossing points of the ramp signal and the sampling signal based on clock signals received from the timing generator 600, and may generate a count value indicating the number of crossing points of the ramp signal and the sampling signal.

The buffer 400 may store the digital signals received from the analog-to-digital converter (ADC) 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify electrical signal corresponding to each count value received from the memory.

The row driver 500 may drive the pixel array 100 in units of a row line in response to an output signal of the timing generator 600. For example, the row driver 500 may generate a selection signal to select any one of the plurality of row lines.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate ramp signals that will be compared with electrical signals (e.g., the sampling signal discussed above) generated by pixels in response to a control signal received from the timing generator 600.

Figure 2:
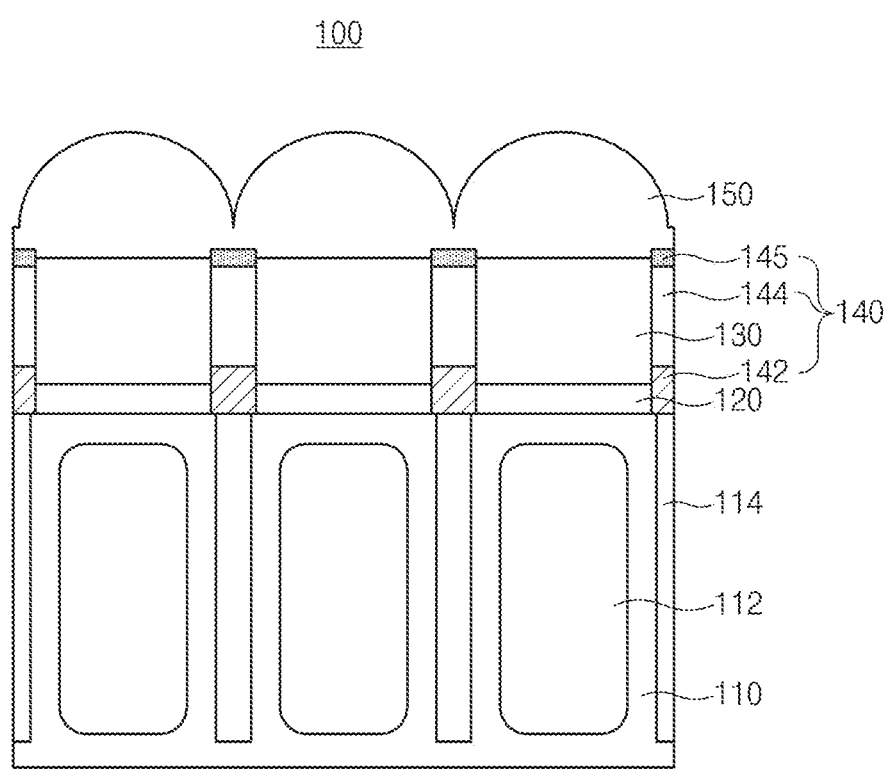
FIG. 2 is an example of a cross-sectional view illustrating a pixel array taken along the line A-A' shown in FIG. 1 based on some implementations of the disclosed technology.

FIG. 2 is an example of a cross-sectional view illustrating the pixel array 100 taken along the line A-A' shown in FIG. 1 based on some implementations of the disclosed technology.

The pixel array 100 of the image sensing device may include a substrate layer 110, a buffer layer 120, at least one color filter layer 130, a grid structure 140, and a lens layer 150.

The substrate layer 110 may include a semiconductor substrate made of a suitable semiconductor material. In some implementations, the semiconductor substrate 110 may include a monocrystalline silicon or a similar material. The semiconductor substrate 110 may include P-type impurities at least in some areas. In the substrate layer 110, a number of photoelectric conversion elements 112 are formed such that a device isolation film 114 isolates each photoelectric conversion element 112 from adjoining photoelectric conversion elements 112.

Each of the photoelectric conversion elements 112 may include an organic or inorganic photodiode. The photoelectric conversion element 112 may include two or more impurity regions vertically stacked within the substrate layer 110. For example, each of the photoelectric conversion elements 112 may include a photodiode in which an N-type impurity region and a P-type impurity region are vertically stacked. The N-type impurity region and the P-type impurity region may be formed by ion implantation. The device isolation 114 may include a deep trench isolation (DTI) structure.

The buffer layer 120 may operate as a planarization layer to provide an even surface for subsequent fabrication processes where structures formed on the substrate layer 110 have uneven surfaces. In some implementations, the buffer layer 120 is substantially transparent to light to be detected by the photoelectric conversion elements 112. In addition, the buffer layer 120 may operate as an anti-reflection film to allow incident light received through the lens layer 150 and the color filter layers 130 to pass through the photoelectric conversion elements 112 of the substrate layer 110. The buffer layer 120 may include a multilayer structure formed by stacking different material layers having different refractive indices. For example, the buffer layer 120 may include a multilayer structure formed by stacking at least one nitride film and at least one oxide film. The nitride film may include a silicon nitride film ($Si_xN_y$, where each of 'x' and 'y' is a natural number) or a silicon oxide nitride film ($Si_xO_yN_z$, where each of 'x', 'y', and 'z' is a natural number). The oxide film may include a monolayer structure formed of any one of an Undoped Silicate Glass (USG) film and an ultra low temperature oxide (ULTO) film, or may include a multilayer structure formed by stacking the USG film and the ULTO film.

The color filter layer 130 may include optical filters located above the photoelectric conversion elements 112 to filter the light to be detected by the photoelectric conversion elements 112. In some implementations, the color filter layer 130 may transmit visible light at a certain wavelength while blocking light at other wavelengths. The color filter layer 130 may include a plurality of color filters. Each unit pixel (PX) includes at least one color filter, and the color filters may be formed to fill the lower parts of the gaps between the grid structures 140. The color filter layer 130 may include a plurality of red color filters (Rs), a plurality of green color filters (Gs), and a plurality of blue color filters (Bs). Each red color filter (R) may transmit only red light from among RGB lights of visible light. Each green color filter (G) may transmit only green light from among RGB lights of visible light. Each blue color filter (B) may transmit only blue light from among RGB lights of visible light. The red filters (Rs), the green filters (Gs), and the blue filters (Bs) may be arranged in a Bayer pattern shape. Alternatively, the color filter layer 130 may include a plurality of cyan filters, a plurality of yellow filters, and a plurality of magenta filters.

Each grid structure 140 may be disposed between color filters R, G, and B adjacent to one another, and may prevent optical crosstalk from occurring between the color filters R, G, and B. Each grid structure 140 may be formed as a hybrid structure including a metal layer 142, an insulation film, an air layer 144, a light guide layer 145, and a capping film. A detailed structure of the grid structure 140 will hereinafter be described in detail.

The lens layer 150 may include a plurality of micro-lenses (and/or a plurality of on-chip lenses) disposed over the color filter layers 130 and the grid structures 140. The plurality of micro-lenses may converge incident light beams received from the outside and may direct the light to the color filter layers 130.

Figure 3:
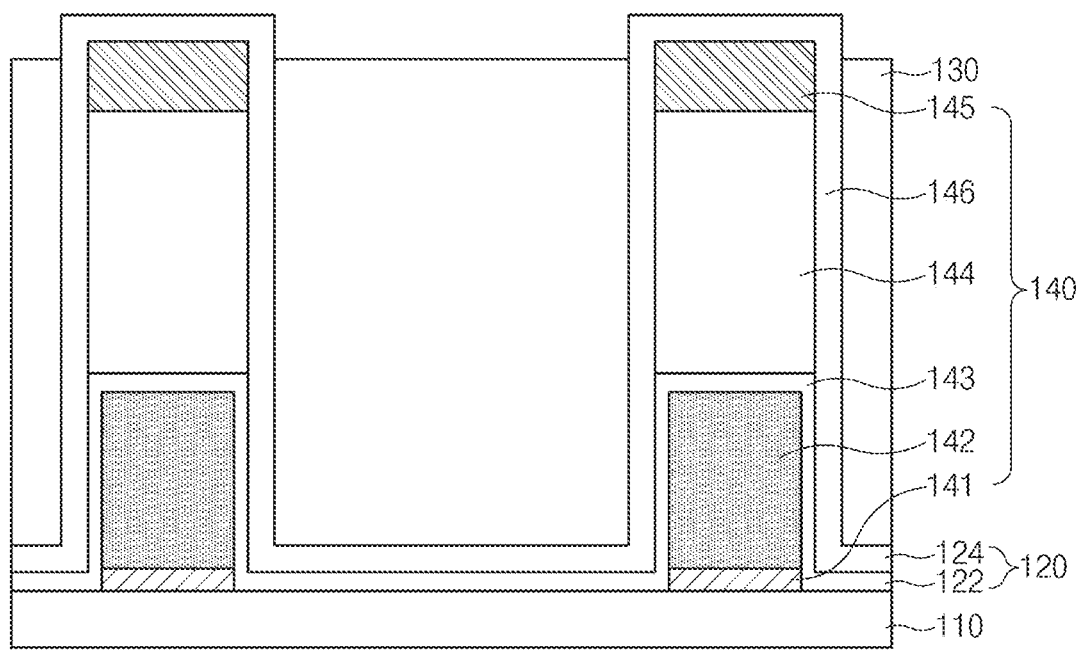
FIG. 3 is an example of a cross-sectional view illustrating a grid structure shown in FIG. 2 based on some implementations of the disclosed technology.

FIG. 3 is a cross-sectional view illustrating the grid structure shown in FIG. 2 based on some implementations of the disclosed technology.

FIG. 3 illustrates only one unit pixel by way of example, and thus it should be noted that in some implementations all the unit pixels in the pixel array 100 may include the grid structure shown in FIG. 3.

Referring to FIG. 3, the grid structure 140 may include a barrier metal layer 141, a metal layer 142, an insulation film 143, an air layer 144, a light guide film 145, and a capping film 146.

The barrier metal layer 141 may include titanium (Ti) and/or titanium nitride (TiN), or may include a stacked structure including titanium (Ti) and/or titanium nitride (TiN). The metal layer 142 may include tungsten (W).

The insulation film 143 may be formed to cover the barrier metal layer 141 and the metal layer 142, such that expansion of such metal material can be prevented in a thermal annealing process. When the insulation film 143 is formed, an insulation film 122 of a buffer layer 120 formed below the color filter layer 130 may also be formed simultaneously with formation of the insulation film 143. In other words, the insulation films 143 and 122 may be formed of the same material films, and may be formed simultaneously with formation through the same deposition process. Each of the insulation films 143 and 122 may include a silicon nitride film ($Si_xN_y$, where each of 'x' and 'y' is a natural number) or a silicon oxide nitride film ($Si_xO_yN_z$, where each of 'x', 'y', and 'z' is a natural number).

The air layer 144 may be formed over the insulation film 143, and the light guide layer 145 may be formed over the air layer 144.

The light guide layer 145 may allow incident light applied to an upper region (i.e., an upper surface or an upper side surface) of the grid structure 140 to be guided to the color filter layer 130 with minimal loss of light by, among others, causing light beams with a large angle of incidence to be reflected between a top surface and a bottom surface of the light guide layer 145 such that those light beams propagate toward a sidewall of the light guide layer 145 and are directed toward a targeted color filter from the sidewall. Additionally, the light guide layer 145 may cause light beams with a small angle of incidence to be deflected toward the targeted color filter. In these ways, the light guide layer 145 may increase/maximize the amount of light that reaches the targeted color filter. The light guide layer 145 may be formed of a material film that is different in refractive index from the color filter layer 130, the air layer 144, the capping film 146, and the lens layer 150. For example, the light guide layer 145 may include at least one of a silicon oxide nitride film ($Si_xO_yN_z$, where each of 'x', 'y', and 'z' is a natural number), and a silicon nitride film ($Si_xN_y$, where each of 'x' and 'y' is a natural number).

Figure 4A:
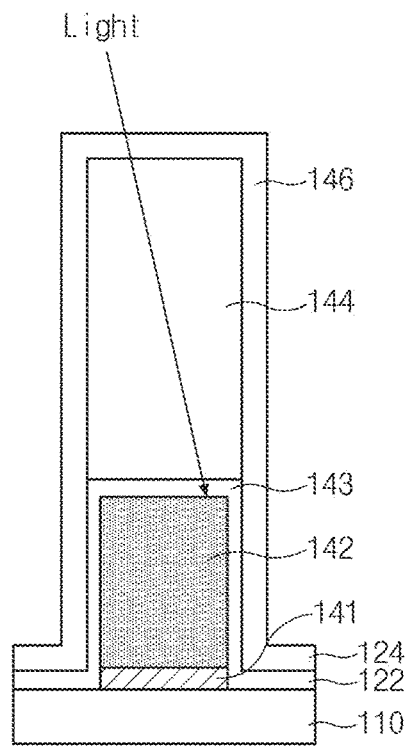
FIG. 4A is an example of a view illustrating light propagation of incident light applied to a top surface of a guide structure when a light guide layer is not formed based on some implementations of the disclosed technology.
Figure 4B:
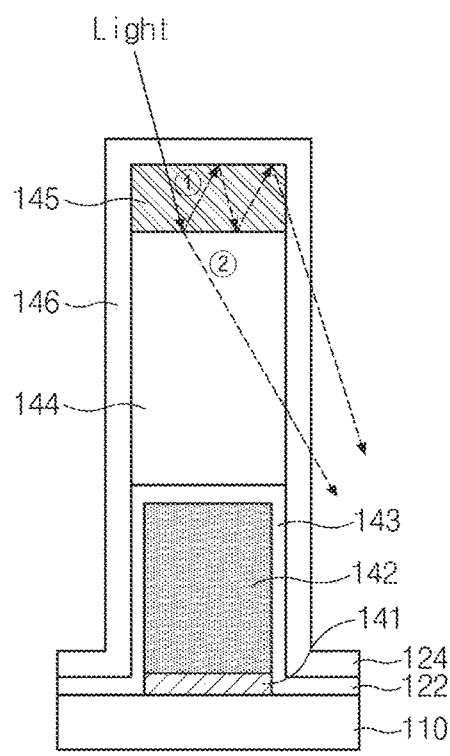
FIG. 4B is an example of a view illustrating light propagation of incident light applied to a top surface of a guide structure when a light guide layer is formed based on some implementations of the disclosed technology.

FIG. 4A is a view illustrating light propagation of light incident upon a top surface of a grid structure that does not include the light guide layer. FIG. 4B is a view illustrating light propagation of light incident upon a top surface of the grid structure implemented based on some embodiments of the disclosed technology, which includes the light guide layer.

Referring to FIG. 4A, when the light guide layer 145 is not formed, some of the incident light beams that pass through the air layer can propagate toward the metal layer instead of a targeted color filter.

However, when the light guide layer 145 having a high refractive index is formed in an upper region of the guide structure as shown in FIG. 4B, first light beams ① of incident light, which otherwise would have been absorbed into the metal layer, may be multiple-reflected within the light guide layer 145, so that a propagation route of the reflected first light beams ① may be directed to the color filter layer 130. Even in the case of second light beams ② that pass through the light guide layer 145, since the light guide layer 145 is different in refractive index from the air layer 144, a refraction angle of the second light beams ② may increase, and may proceed to the color filter layer 130 without being absorbed into the metal layer 142.

As depicted in FIG. 4B, more light may be directed into the color filter layer 130 as compared to the structure of FIG. 4A, such that more light can be acquired by the corresponding photoelectric conversion element 112 below the color filter layer 130 as compared to the structure of FIG. 4A.

In addition, when light beams are multiple-reflected from the light guide layer 145, some light beams corresponding to some wavelengths may be reinforced, and some other light beams corresponding to some other wavelengths may be offset against each other. In this case, the reinforced or offset wavelengths may vary depending on a thickness and refractive index of the light guide layer 145. Some embodiments of the disclosed technology may be implemented to adjust the thickness and refractive index of the light guide layer 145 such that a light beam having a desired wavelength (i.e., light having a desired color) can be more effectively guided by the light guide layer 145.

Light beams denoted by dotted arrows of FIG. 4B may indicate some parts of incident light beams denoted by a solid line. That is, the image sensing device based on some embodiments of the disclosed technology may allow more light beams to be directed toward the color filter layer 130. In some cases, all light beams incident upon the light guide layer 145 may not be directed toward the color filter layer 130 as shown in FIG. 4B.

The capping film 146 may include a material film formed at an outermost part of the grid structure 140 to surround or cover the barrier metal layer 141, the metal layer 142, the insulation film 143, the air layer 144, and the light guide layer 145. A capping film 124 of the buffer layer 120 formed below the color filter layer 130 may be formed simultaneously with formation of the capping film 146. That is, the capping films 146 and 124 may be formed of the same material films, and may be simultaneously formed by the same deposition process. The capping film 146 may include a multilayer structure including an oxide film. For example, the capping film 146 may be formed of a double oxide film (two oxide films) or may be formed of a multilayer structure formed by stacking an oxide film and other material films different from the oxide film. Preferably, the capping film 146 may include an ultra low temperature oxide (ULTO) film such as a silicon oxide film ($SiO_2$). In one example, the ULTO film may include an oxide film that is formed by a low-temperature process such as a chemical vapor deposition.

FIGS. 5A to 5F are cross-sectional views illustrating processes for forming the structure of FIG. 3 based on some implementations of the disclosed technology.

Figure 5A:
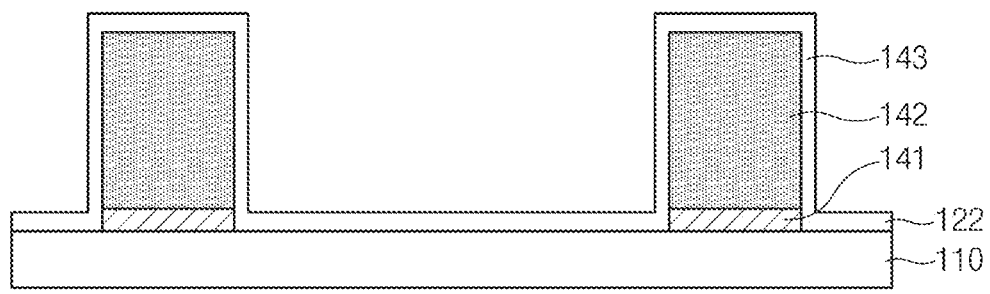
FIGS. 5A to 5F are cross-sectional views illustrating processes for forming the structure of FIG. 3 based on some implementations of the disclosed technology.

Referring to FIG. 5A, the barrier metal layer 141 and the metal layer 142 may be formed over the substrate 110 including the photoelectric conversion element 112.

For example, a barrier metal material and a metal material may be sequentially formed over the substrate layer 110. Thereafter, the barrier metal material and the metal material may be patterned using a mask pattern (not shown) defining a region of the metal layer of the grid structure, resulting in formation of a stacked structure of the barrier metal layer 141 and the metal layer 142. In this case, the barrier metal material may include any one of titanium (Ti) and titanium nitride (TiN), or may include a stacked structure of titanium (Ti) and titanium nitride (TiN). The metal material may include tungsten (W).

Subsequently, the insulation films 122 and 143 may be formed over the substrate 110, the barrier metal layer 141, and the metal layer 142. In this case, the insulation film 122 formed over the substrate 110 may be used as a part of the buffer layer 120, and the insulation film 143 capping both the barrier metal layer 141 and the metal layer 142 may be used as a part of the grid structure.

Each of the insulation films 122 and 143 may include a silicon nitride film ($Si_xN_y$, where each of 'x' and 'y' is a natural number) or a silicon oxide nitride film ($Si_xO_yN_z$, where each of 'x', 'y', and 'z' is a natural number).

Figure 5B:
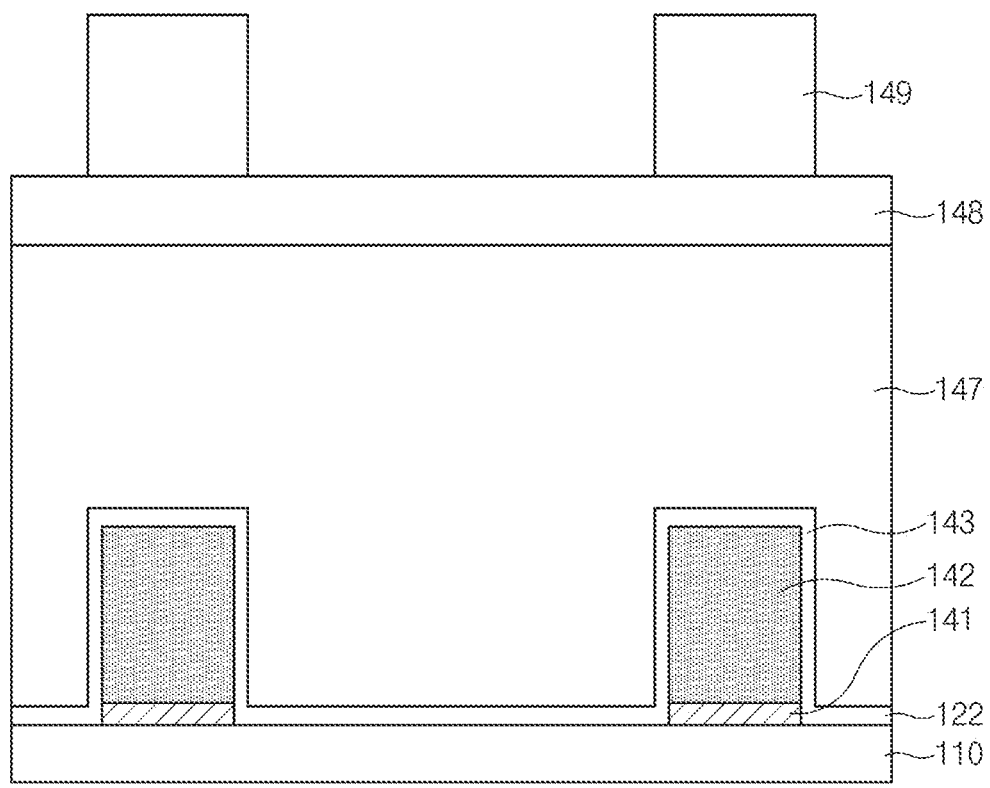

Referring to FIG. 5B, a sacrificial film 147 may be formed over the insulation films 122 and 143, and a light guide material layer 148 may be formed over the sacrificial film 147.

In this case, the sacrificial film 147 may include a carbon-containing Spin On Carbon (SOC) film. The light guide material layer 148 may be different in etch selectivity from the sacrificial film 147, and may include an insulation film that is different in refractive index from the color filter layer 130 and the lens layer 150 to be formed in a subsequent process.

Subsequently, a mask pattern 149 defining a region of the air layer 144 of the grid structure 140 may be formed over the light guide material layer 148.

The mask pattern 149 may include a photoresist pattern.

Figure 5C:
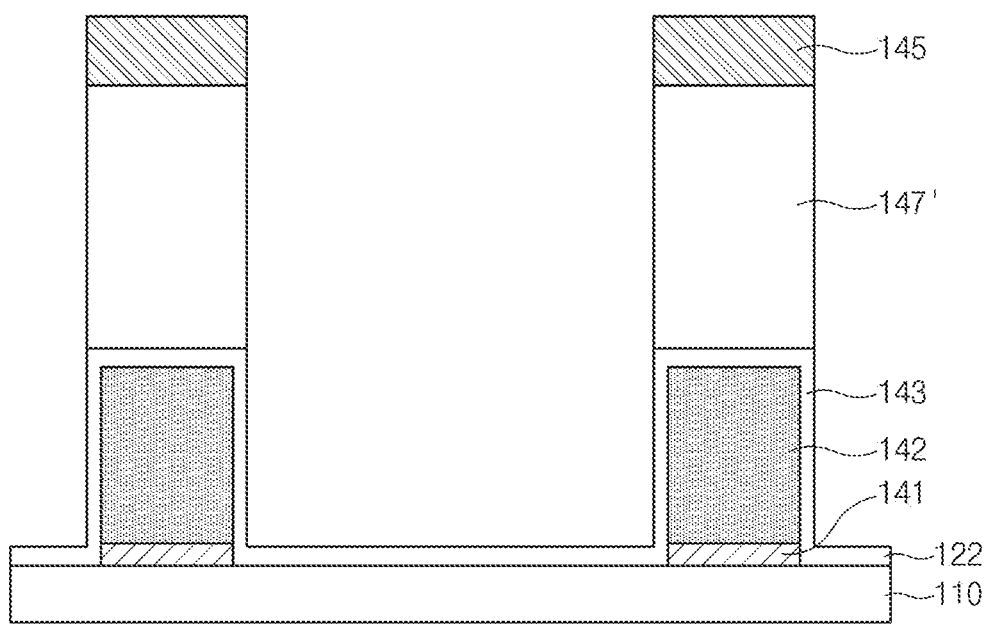

Referring to FIG. 5C, the light guide material layer 148 and the sacrificial film 147 may be sequentially etched using the mask pattern 149 as an etch mask, such that a stacked structure of the sacrificial film pattern 147' and the light guide layer 145 may be formed over the insulation film 143.

Figure 5D:
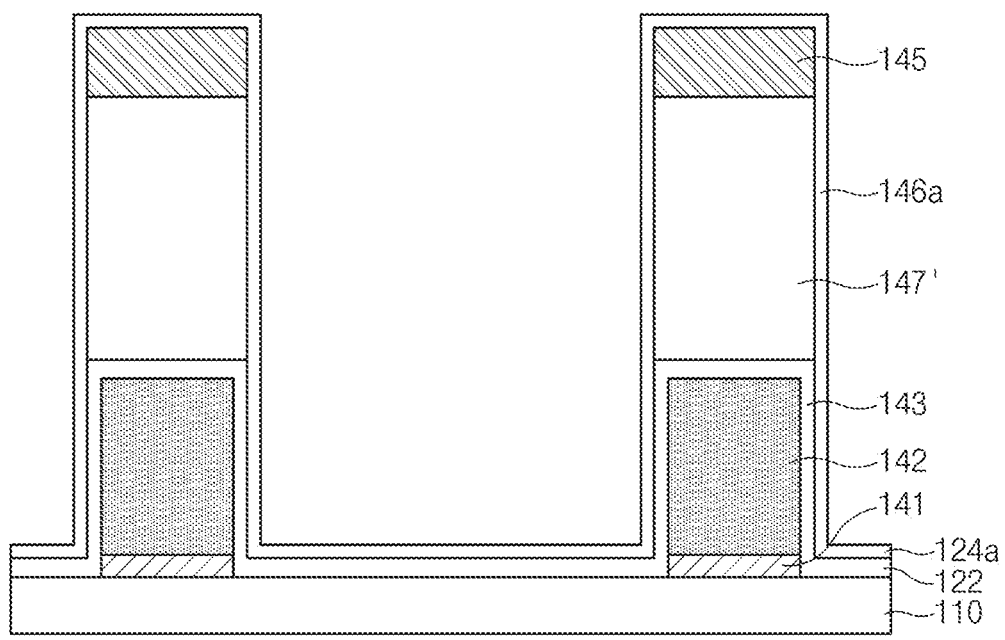

Referring to FIG. 5D, first capping films 124a and 146a may be formed over the insulation films 122 and 143, the sacrificial film 147's, and the light guide layer 145.

Each of the first capping films 124a and 146a may include an oxide film, preferably, a ULTO film. Specifically, the first capping film 146a may be formed to a predetermined thickness through which molecules formed by combining gas to be used in a subsequent plasma process with carbon of the sacrificial film pattern 147' can be easily discharged outside. Preferably, the first capping film 146a may be formed to a thickness of 300 Å or less.

Figure 5E:
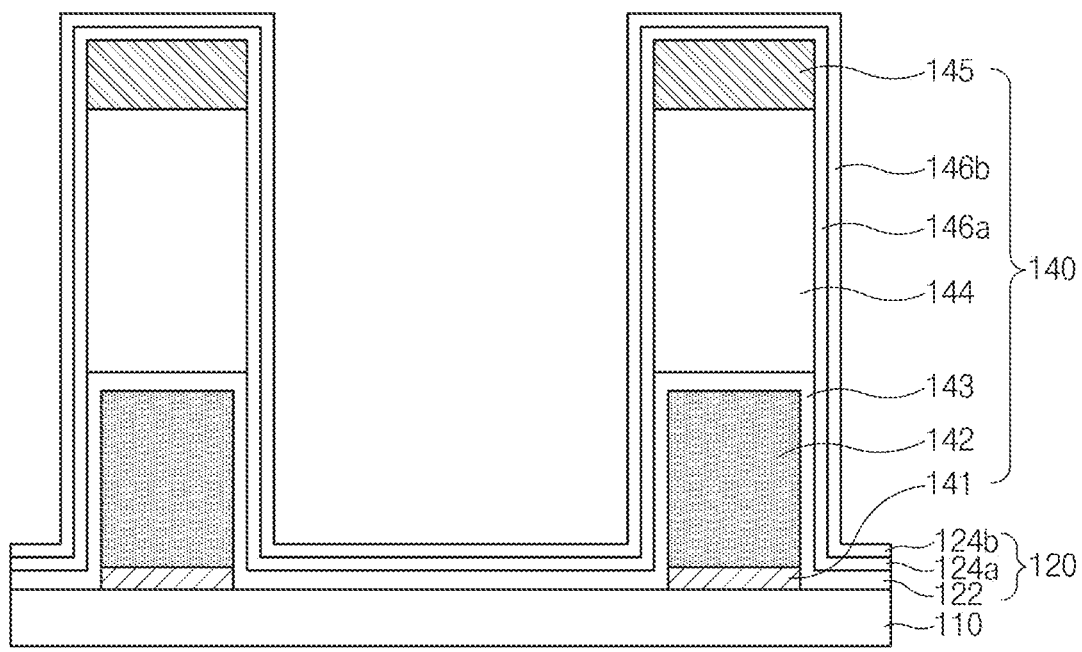

Referring to FIG. 5E, the plasma process may be carried out upon the resultant structure of FIG. 5D, such that the sacrificial film pattern 147' may be removed and the air layer 144 may be formed at the position from which the sacrificial film pattern 147' is removed. In this case, the plasma process may be carried out using gas (e.g., $O_2$, $N_2$, $H_2$, CO, $CO_2$, or $CH_4$) including at least one of oxygen, nitrogen, and hydrogen.

If the $O_2$ plasma process is carried out upon the resultant structure of FIG. 5D, oxygen radicals (O*) may flow into the sacrificial film pattern 147' through the first capping film 146a, and the oxygen radicals (O*) included in the sacrificial film pattern 147' may be combined with carbons of the sacrificial film pattern 147', resulting in formation of CO or $CO_2$. The formed CO or $CO_2$ may be discharged outside through the first capping film 146a. As a result, the sacrificial film pattern 147' may be removed, and the air layer 144 may be formed at the position from which the sacrificial film pattern 147' is removed.

In this case, the light guide layer 145 may also prevent collapse of the first capping film 146a when the sacrificial film 147' is removed. In other words, in order to more effectively remove the sacrificial film 147' during the plasma process, it is necessary for the first capping film 146a to be formed as thin as possible in a manner that the first capping film 146a is formed to a very thin thickness. Therefore, in a situation in which the light guide layer 145 is not formed over the sacrificial film 147' and only the sacrificial film pattern 147' is formed, if the sacrificial film pattern 147' is removed, the first capping film 146a may be easily collapsed.

In contrast, when the light guide layer 145 is formed over the sacrificial film pattern 147' according to the present embodiment, although the sacrificial film pattern 147' is removed, collapse of the first capping film 146a can be prevented.

Subsequently, the second capping films 146b and 124b may be formed over the first capping films 146a and 124a.

That is, when the first capping film 146a is formed to a thick thickness, the above-mentioned plasma process may have difficulty not only in removing the sacrificial film pattern 147', but also in forming the air layer 144. Therefore, the first capping film 146a according to the embodiment may be formed as thin as possible in a manner that the first capping film 146a is formed to a very thin thickness.

However, when the capping film 146 is formed of only the first capping film 146a formed as a thin film, the capping film 146 may be collapsed by the expansion of air layer in a subsequent thermal annealing process or the like. Therefore, the second capping film 146b may be additionally formed over the first capping film 146a after completion of the plasma process. As a result, the final capping film 146 may be formed to a predetermined thickness through which the shape of the grid structure 140 can be stably maintained.

The second capping film 124b may be additionally formed over the first capping film 124a disposed between the grid structures 140, resulting in formation of the buffer layer 120.

Figure 5F:
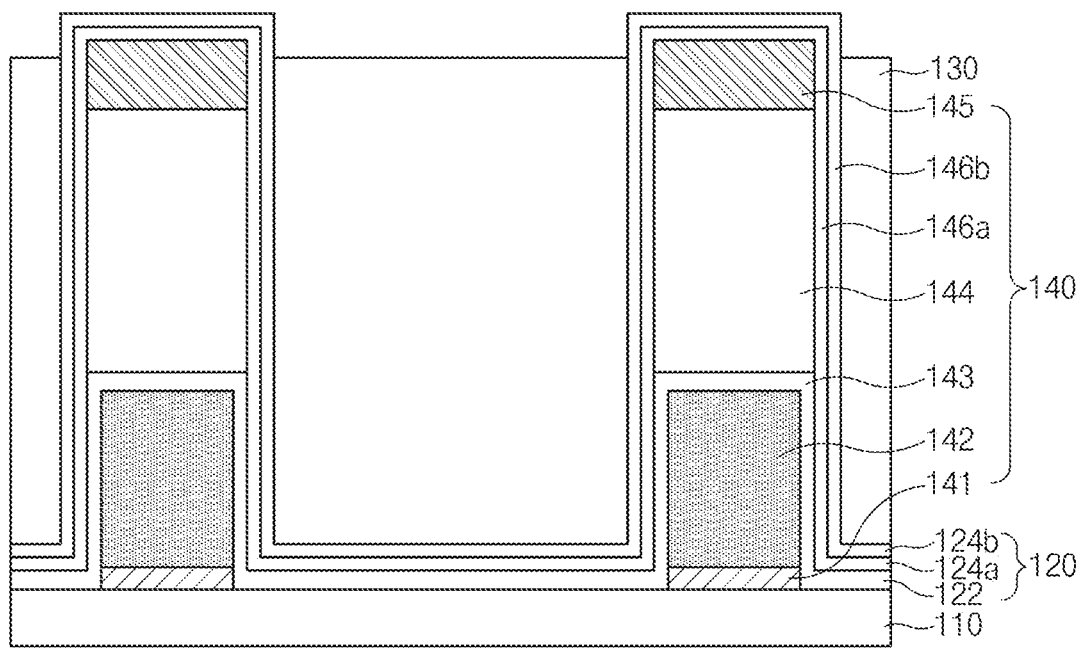

Referring to FIG. 5F, the color filter layer 130 may be formed over the buffer layer 120 in a manner that a gap between the grid structures 140 can be buried with the color filter layer 130.

As is apparent from the above description, the image sensing device according to the embodiment of the disclosed technology may guide incident light applied to an upper region of the grid structure using the light guide layer, resulting in an increased amount of photoelectric conversion light.

The image sensing device according to the embodiment of the disclosed technology can more effectively guide light having a specific wavelength by adjusting thickness and a refractive index of the light guide layer.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensing device comprising:
a substrate layer structured to include photoelectric conversion elements;
grid structures disposed over the substrate layer to divide space above the substrate into different sensing regions; and
color filter layers disposed over the photoelectric conversion elements between adjacent grid structures, respectively,
wherein each of the grid structures includes:
an air layer;
a light guide layer disposed over the air layer; and
a capping film configured to cover the air layer and the light guide layer.

2. The image sensing device according to claim 1, further comprising:
a lens layer disposed over the light guide layer and the color filter layer.

3. The image sensing device according to claim 2, wherein the light guide layer includes:
a material film different in refractive index from the color filter layer and the lens layer.

4. The image sensing device according to claim 3, wherein the light guide layer includes:
at least one of a silicon oxide nitride film ($Si_xO_yN_z$, where each of 'x', 'y', and 'z' is a natural number) or a silicon nitride film ($Si_xN_y$, where each of 'x' and 'y' is a natural number).

5. The image sensing device according to claim 1, wherein each of the grid structures further includes:
a metal layer disposed below the air layer; and
an insulation film for capping the metal layer.

6. The image sensing device according to claim 5, wherein the insulation film is formed to extend to a lower portion of the color filter layer.

7. The image sensing device according to claim 1, wherein the capping film includes:
a first capping film for covering the air layer and the light guide layer; and
a second capping film formed over the first capping film.

8. The image sensing device according to claim 7, wherein the first capping film includes an ultra low temperature oxide (ULTO) film.

9. The image sensing device according to claim 1, wherein the capping film is formed to extend to a lower portion of the color filter layer.

10. An image sensing device comprising:
a substrate layer in which an array of photoelectric conversion elements is formed;
grid structures disposed over the substrate layer to divide space above the substrate into different sensing regions; and
color filter layers disposed over the photoelectric conversion elements between adjacent grid structures, respectively,
wherein each of the grid structures includes a light guide layer at an upper portion of the grid structure, and
wherein the light guide layer is structured to:
cause first light beams of incidence light to be reflected within top and bottom surfaces of the light guide layer and propagate toward a targeted color filter from a sidewall of the light guide layer; and
cause second light beams of incidence light to be deflected toward the targeted color filter through the light guide layer.

11. The image sensing device according to claim 10, further comprising:
a lens layer disposed over the grid structure and the color filter layer.

12. The image sensing device according to claim 11, wherein the light guide layer includes:
   a material film different in refractive index from the color filter layer and the lens layer.

13. The image sensing device according to claim 12, wherein the light guide layer includes:
   at least one of a silicon oxide nitride film ($Si_xO_yN_z$, where each of 'x', 'y', and 'z' is a natural number) or a silicon nitride film ($Si_xN_y$, where each of 'x' and 'y' is a natural number).

14. The image sensing device according to claim 10, wherein each of the grid structures further includes:
   air layer,
   a metal layer disposed below the air layer; and
   an insulation film formed to cover the metal layer.

* * * * *